United States Patent [19]

Roohparvar

[11] Patent Number: 5,590,089
[45] Date of Patent: Dec. 31, 1996

[54] ADDRESS TRANSITION DETECTION (ATD) CIRCUIT

[75] Inventor: Frankie F. Roohparvar, Cupertino, Calif.

[73] Assignee: Micron Quantum Devices Inc., Santa Clara, Calif.

[21] Appl. No.: 506,168

[22] Filed: Jul. 25, 1995

[51] Int. Cl.$^6$ .................................................. G11C 8/00
[52] U.S. Cl. ................................. 365/233.5; 365/189.11
[58] Field of Search ............................. 365/233.5, 203, 365/189.11; 327/14; 326/93

[56] References Cited

U.S. PATENT DOCUMENTS

| | | | |
|---|---|---|---|
| 4,636,991 | 1/1987 | Flannagan | 365/233.5 |
| 4,710,904 | 12/1987 | Suzuki | 365/233.5 |
| 4,893,282 | 1/1990 | Wada | 365/233.5 |
| 5,243,575 | 9/1993 | Sambandan et al. | 365/233.5 |

*Primary Examiner*—A. Zarabian
*Attorney, Agent, or Firm*—Limbach & Limbach

[57] ABSTRACT

An address transition detection (ATD) circuit for use in a memory generates a first pulse in a first node in response to a change in state of an address signal and generates a second pulse in a second node in response to a change in state of the address signal. A load circuit accelerates assertion of the first pulse in response to assertion of the second pulse and accelerates deassertion of the first pulse in response to deassertion of the second pulse.

41 Claims, 8 Drawing Sheets

ADDRESS TRANSITION DETECTION (ATD) CIRCUIT

BACKGROUND OF THE INVENTION

1. Field of the Invention

The present invention relates to digital memories, and more particularly, to an address transition detection circuit for use in a digital memory.

2. Description of the Related Art

Address transition detection (ATD) circuits are commonly used in high speed digital memories. An ATD circuit detects whether there has been a transition made on its associated address line and generates a signal indicating the change. Because such a transition normally indicates that the user is accessing the memory to either read or write data, the detection of the transition can be used by a memory to signal the start of a sequence. In a read operation this results in new data being provided on the memory's output lines. The sequence can be partitioned into time segments so that the appropriate circuits are turned on at the appropriate times. This can keep the maximum peak currents under control which can help to reduce noise.

The use of ATD circuits can improve the speed and reduce the power consumption of a memory. Specifically, certain nodes can be pre-conditioned in response to the detected address line transitions. Such pre-conditioning improves the response time of the nodes. Furthermore, detecting address line transitions can be used to initiate the sequencing of the usage of power among the actual circuits which are used to provide the new data.

There are several factors which should be taken into consideration when designing an ATD circuit. Specifically, the circuit should be able to detect a transition on the address lines very quickly, especially in read operations where speed is often critical. A delay in the detection causes an increase in the access time which is contrary to the intended function of the circuit. Once a transition has been detected, the circuit generates a pulse which indicates to other circuitry that the respective address line has experienced a transition. The width of this pulse is normally carefully designed and controlled so that the duration of the pulse does not slow the access time.

The subject invention is best illustrated by first describing some aspects of a conventional memory system. FIG. 1 shows an exemplary conventional memory system 13. The core of the system is an Array 15 of memory cells, in this case flash memory cells, arranged in rows and columns with there being a total of 256K of eight bit words (one byte) in the Array. The individual cells (not depicted) are addressed by eighteen bits or address A0–A17, with nine bits being used by an X Decoder 17 to select the row of the Array 15 in which the target cell is located and the remaining nine bits being used by a Y decoder 19 to select the appropriate column of the Array 15.

Memory system 13 is of the type which contains an internal State Machine 21 to control the detailed operations of the memory system 13 such as the various individual steps necessary for carrying out programming, reading and erasing operations. The State Machine 21 thus functions to reduce the overhead required of the processor (not depicted) typically used in association with the memory system 13. Since programming and erasing operations for flash memories are relatively slow, these devices are considered to be "read mostly" memories where read access times determine the overall memory performance.

The address inputs A0–A17 are first received by an address buffer/latch 23. FIG. 2 shows a conventional ATD circuit 10 which may be included in the address buffer/latch 23. FIG. 3 shows the address cell 11 which receives the first address input A0. The other address inputs A1, A2, up to A17 have their own associated address cells 22, 24 and 26, respectively, which are identical to address cell 11.

The address cell 11 has two outputs. Output AddATDp0 indicates a positive transition on address input A0, and output AddATDn0 indicates a negative transition on address input A0. Some conventional address cells, however, have a single output which is activated whether the address transition is positive or negative. Furthermore, address cell 11 includes first and second one shot generators 12 and 14. Address input A0 is connected to the input of a TTL buffer 16, the output of which is connected through an inverter 18 to the first one shot 12. The first and second one shots 12 and 14 are connected together by an inverter 20 so that the two one shots will trigger on opposite polarity transitions.

Referring to FIG. 4, as the address input A0 changes state 25 or 31, one of the two one shots 12 or 14 generates a pulse 27 or 29, respectively, referred to herein as an ATD pulse, signifying that activity. Specifically, the first one shot 12 generates the ATD pulse 27 at the AddATDp0 output when the address line A0 experiences a positive transition 25, and the second one shot 14 generates the ATD pulse 29 at the AddATDn0 output when the address line A0 experiences a negative transition 31. The width of the ATD pulse 27 generated by the first one shot 12 is determined by the delay caused by the inverters 34, 36 and 38. Similarly, the width of the ATD pulse 29 generated by the second one shot 14 is determined by the delay caused by the inverters 40, 42 and 44.

Because each of the address inputs A0–A17 has its own address cell, a change on all of the address inputs causes 18 ATD pulses to be generated. However, when a new address is sent to the memory system 13, it is common for all of the address inputs A0–A17 to not change at exactly the same time. This results in the 18 ATD pulses not being generated at exactly the same time. In order to start the read sequence which results in new data being provided on the memory's output lines, it is important to know when the first one of the address inputs A0–A17 has experienced a transition. This is accomplished by ORing all of the outputs of the address cells 11, 22, 24, and 26 together. Due to the number of the address inputs A0–A17 and the fact that each address cell 11, 22, 24, and 26 will send either one or two lines to the OR circuit, a distributed OR gate 28 is usually implemented. The OR gate 28 generates an output pulse ATDout which is used by the memory system 13 to start the above-mentioned sequence.

Assuming that only two address inputs A0 and A1 are present in the memory system 13, as is shown in FIG. 4, the output pulse ATDout goes high 33 when the ATD pulse 27 AddATDp0 goes high, and the output pulse ATDout goes low 35 when the ATD pulse 41 AddATDp1 goes low. Similarly, the output pulse ATDout goes high 37 when the ATD pulse 29 AddATDn0 goes high, and the output pulse ATDout goes low 39 when the ATD pulse 43 AddATDn1 goes low. In other words, the output pulse ATDout goes high in response to the first address input which experiences a transition, and the output pulse ATDout returns low in response to the last ATD pulse going low, i.e., after all address inputs have transitioned and stabilized. Thus, if there is any transition on any of the address lines, a pulse is generated on the output ATDout.

Ideally, the timing of the address line transitions will be such that each ATD pulse will overlap with at least one other ATD pulse. For example, as shown in FIG. 4, the ATD pulse 27 AddATDp0 overlaps with the ATD pulse 41 AddATDp1. If all of the ATD pulses overlap with at least one other ATD pulse, then a single continuous output pulse ATDout will be generated by the OR gate 28.

FIG. 2 shows that all of the AddATDp and AddATDn lines are routed to the OR gate 28. This means that in the memory system 13, which has 18 address lines, 36 lines would have to be sent to the OR gate 28. This scenario has the disadvantage of causing a significant amount of bussing and silicon usage. Furthermore, many of the AddATDp and AddATDn lines would be running long distances to the OR gate 28, and as such, the drivers of the AddATDp and AddATDn signals would need to be sized up which would either have an adverse effect on the die space or speed. One way to reduce the number of lines that are routed is to OR the AddATDp and AddATDn outputs inside each of the address cells 11, 22, 24, and 26 and then route only one line for each circuit to the OR gate 28. However, this scenario has the disadvantage of causing another one or two delay states in the path of these signals. Any additional delay in the AddATDp and AddATDn outputs also delays the generation of the output pulse ATDout which should be extremely responsive and fast.

An alternative implementation of the circuit shown in FIG. 2 is to route line 30 of the OR gate 28 to each of the address cells 11, 22, 24, and 26, rather than sending the AddATDp and AddATDn lines to the OR gate 28. Thus, rather than having the AddATDp and AddATDn lines travel, the line 30 travels. In this scenario the OR gate 28 is distributed across all of the address cells 11, 22, 24, and 26. Because only the one line 30 is routed, the real estate penalty is minimized. The drawback, however, is managing the OR gate 28 structure and its associated load 32. As shown in FIG. 2, a load circuit 32 is associated with the OR gate 28 in this approach. Due to the number of address lines, there is a large capacitive load on line 30. Because of this large capacitance, the load 32 must be large enough (i.e., have a small impedance) to pull line 30 up once the AddATDp and AddATDn signals have been deasserted. Otherwise, the output pulse ATDout will be deasserted slowly, as shown at 35 and 39 in FIG. 4. However, if the load 32 is large, it is difficult to pull line 30 down during AddATDp and AddATDn assertion. This causes the output pulse ATDout to be asserted slowly, as shown at 33 and 37 in FIG. 4. In order to speed up the pull down of line 30, the AddATDp and AddATDn pull downs can be beefed up; however, this also creates additional speed problems by increasing the capacitance loading on the outputs of the AddATDp and AddATDn drivers.

Thus, there is a need for an ATD circuit in which the number of lines which are routed across the die is minimized in order to conserve die real estate. Furthermore, there is a need for an ATD circuit having an output pulse which is asserted as fast as possible in response to an address line transition, and which is deasserted as fast as possible after all address lines have transitioned and stabilized.

SUMMARY OF THE INVENTION

The present invention provides an address transition detection (ATD) circuit for use in a memory. An input means receives an address signal. A discharging means provides a discharge path from a first node to a first voltage reference node for a first time period in response to a change in state of the address signal. A charging means provides a charging path from a second voltage reference node to a second node for a second time period in response to a change in state of the address signal. A load means accelerates discharging of the first node by turning off in response to charging of the second node. The load means also accelerates charging of the first node in response to expiration of the second time period.

The present invention also provides an address transition detection (ATD) circuit for use in a memory. An input means receives an address signal. A first pulse means generates a first pulse in a first node in response to a change in state of the address signal. A second pulse means generates a second pulse in a second node in response to a change in state of the address signal. A load means, which is coupled to the first and second nodes, accelerates assertion of the first pulse in response to assertion of the second pulse. The load means also accelerates deassertion of the first pulse in response to deassertion of the second pulse.

The present invention also provides a memory system having an array of memory cells, input means for receiving a plurality of address signals, and decoder means, coupled to the array of memory cells, for decoding the plurality of address signals to select a row and a column of the array of memory cells. A plurality of address cells is coupled to the input means so that each address cell receives an associated one of the address signals. Each of the address cells includes first and second pulse means for generating first and second pulses, respectively, in response to a change in state of the associated address signal. An output circuit includes load means for accelerating assertion of the first pulse generated by any one of the address cells in response to assertion of the second pulse and for accelerating deassertion of the first pulse generated by any one of the address cells in response to deassertion of the second pulse.

The present invention also provides a method of detecting address line transitions in a memory. The method includes the steps of: (a) generating a first pulse in a first node in response to a change in state of an address signal; (b) generating a second pulse in a second node in response to a change in state of the address signal; (c) accelerating assertion of the first pulse in response to assertion of the second pulse; (d) generating an output pulse in an output node in response to the first pulse; (e) feeding the output pulse back to be used to prepare for deassertion of the first pulse in response to the output pulse; and (f) accelerating deassertion of the first pulse in response to deassertion of the second pulse.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

Figure 5:
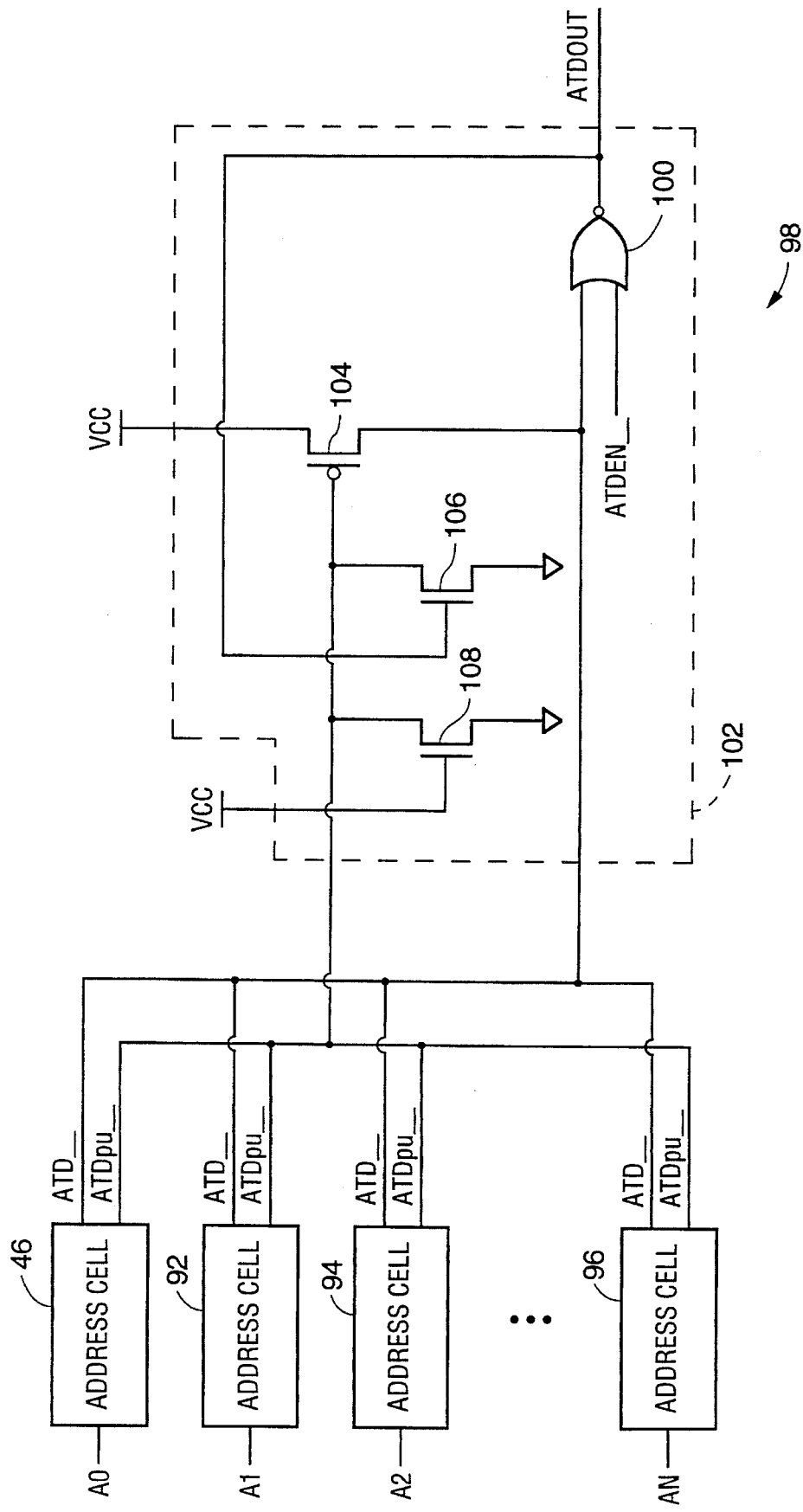
FIG. 5 is a schematic diagram illustrating an ATD circuit in accordance with the present invention.
Figure 6:
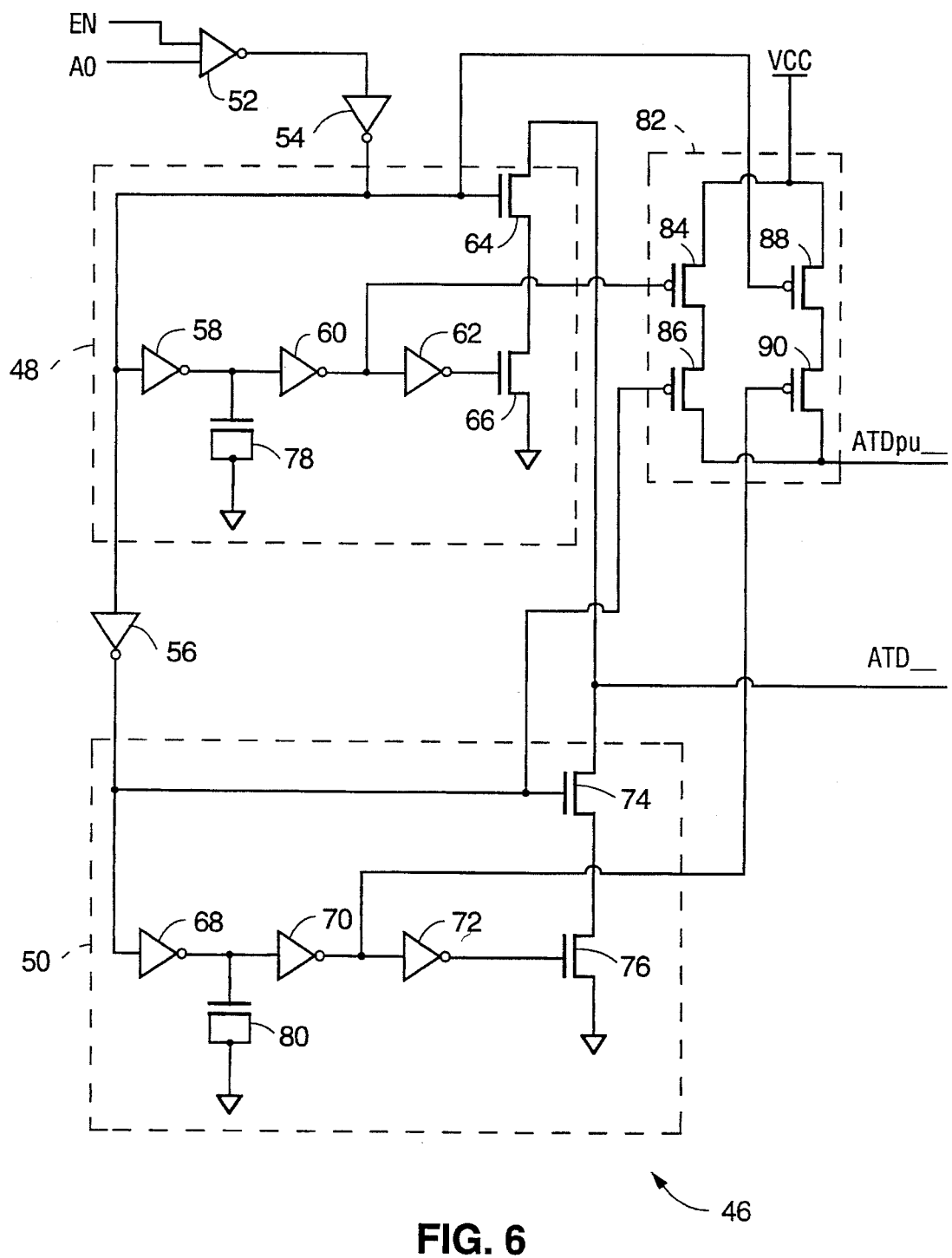
FIG. 6 is a schematic diagram illustrating one of the address cells shown in FIG. 5.

Referring to FIG. 5, there is illustrated an ATD circuit 98 in accordance with the present invention. FIG. 6 illustrates one of the address cells 46 which is used in the ATD circuit 98. The ATD circuit 98 is capable of asserting its output pulse ATDout very fast in response to an address line transition. Furthermore, after all of the address lines have transitioned and stabilized, the ATD circuit 98 deasserts the output pulse ATDout very fast. The ATD circuit 98 is capable of performing its function using less silicon real estate and line routing than the prior art ATD circuit 10 discussed above.

The ATD circuit 98 receives address inputs A0–AN. It may be used with many different types of memories having many different numbers of address inputs. The ATD circuit 98 is particularly useful in very high speed flash memories.

The address cell 46 includes first and second one shot generators 48 and 50. Furthermore, the address line A0 is connected to the input of a TTL buffer 52, the output of which is connected through an inverter 54 to the first one shot 48. The first and second one shots 48 and 50 are connected together by an inverter 56.

The first one shot 48 includes three inverters 58, 60, and 62, as well as two n-channel transistors 64 and 66, all connected substantially as shown. Furthermore, an n-channel transistor 78 is capacitor connected between the input of the inverter 60 and ground. In other words, the gate of n-channel transistor 78 functions as one capacitor terminal, and the drain and source, which are connected together, function as the other capacitor terminal. Similarly, the second one shot 50 includes three inverters 68, 70, and 72, as well as two n-channel transistors 74 and 76, all connected substantially as shown. An n-channel transistor 80 is capacitor connected between the input of the inverter 70 and ground. The drains of n-channel transistors 64 and 74 are coupled together to form a first output ATD_. Thus, the output ATD_ is generated by pull down elements, namely, n-channel transistors 64, 66, 74, and 76.

A pull-up circuit 82 includes p-channel transistors 84, 86, 88, and 90, all connected together substantially as shown. Specifically, the gate of p-channel transistor 84 is coupled to the output of inverter 60. The gate of p-channel transistor 86 is coupled to the output of inverter 56. The gate of p-channel transistor 88 is coupled to the output of inverter 54. And the gate of p-channel transistor 90 is coupled to the output of inverter 70. The sources of p-channel transistors 84 and 88 are coupled to the voltage supply VCC, and the drains of p-channel transistors 86 and 90 form a second output ATDpu_. Thus, the ATDpu_ output is generated by pull up elements, namely, p-channel transistors 84, 86, 88, and 90.

Figure 1:
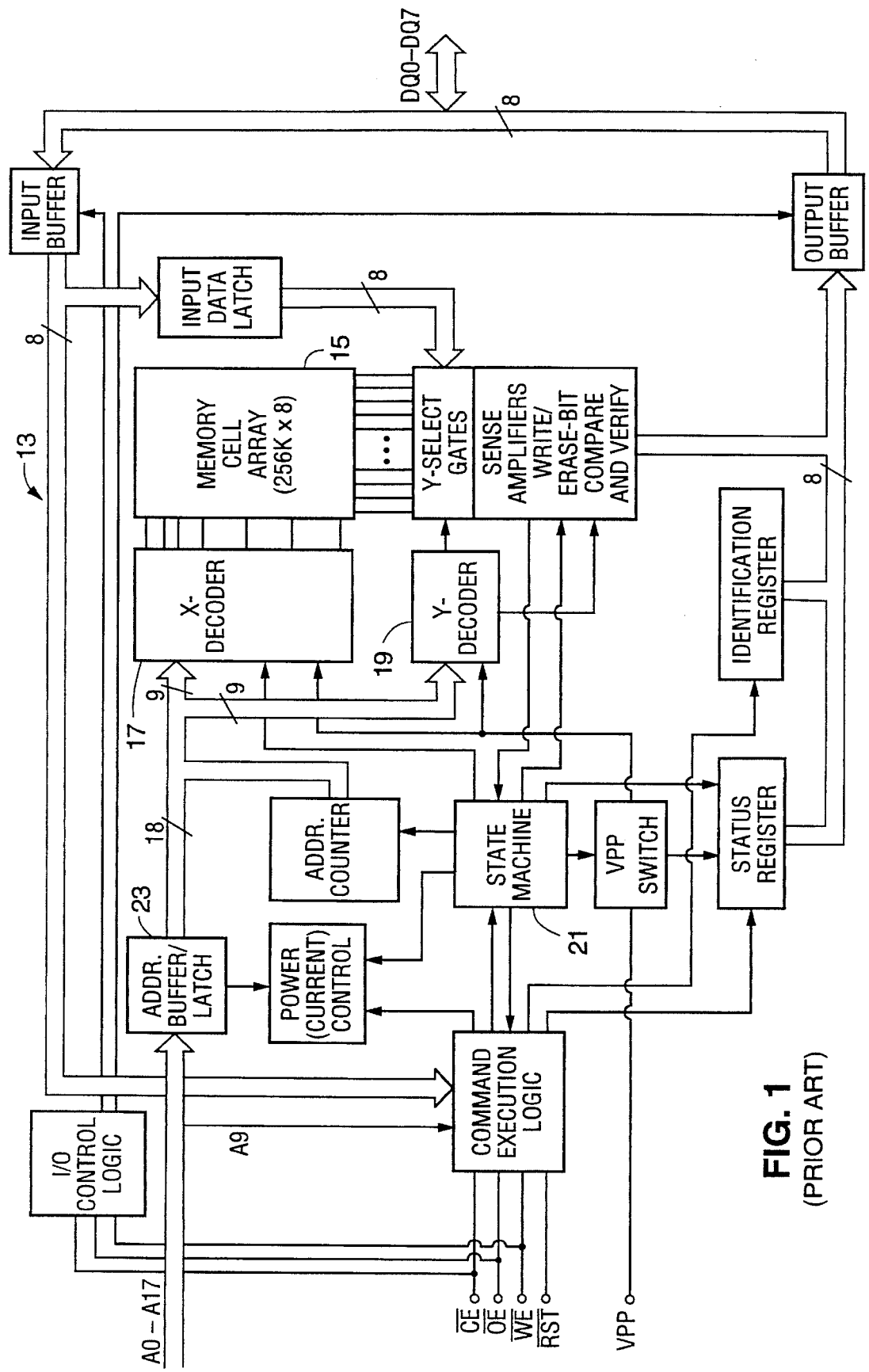
FIG. 1 is a block diagram illustrating a prior art memory system.
Figure 2:
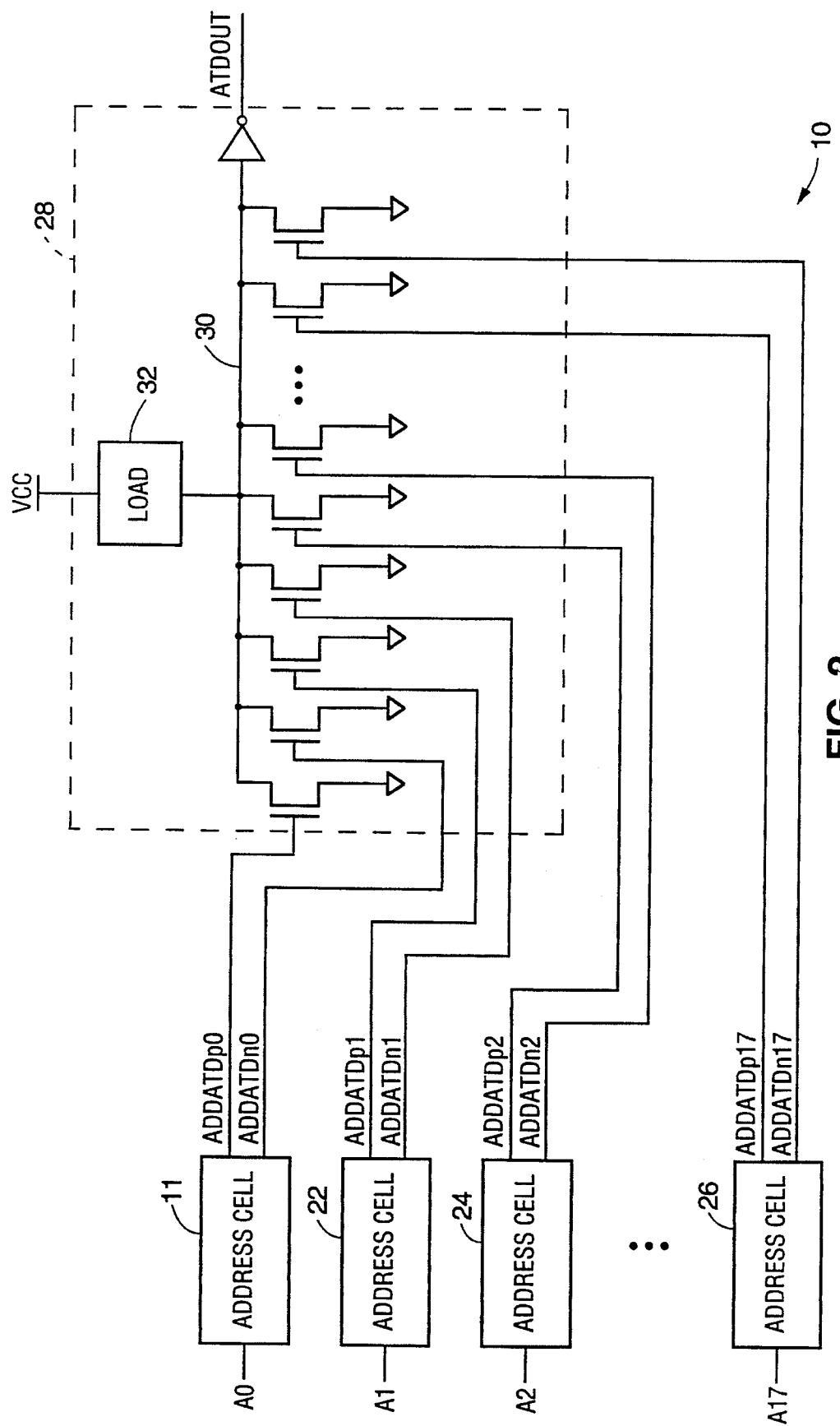
FIG. 2 is a schematic diagram illustrating a prior art ATD circuit.
Figure 3:
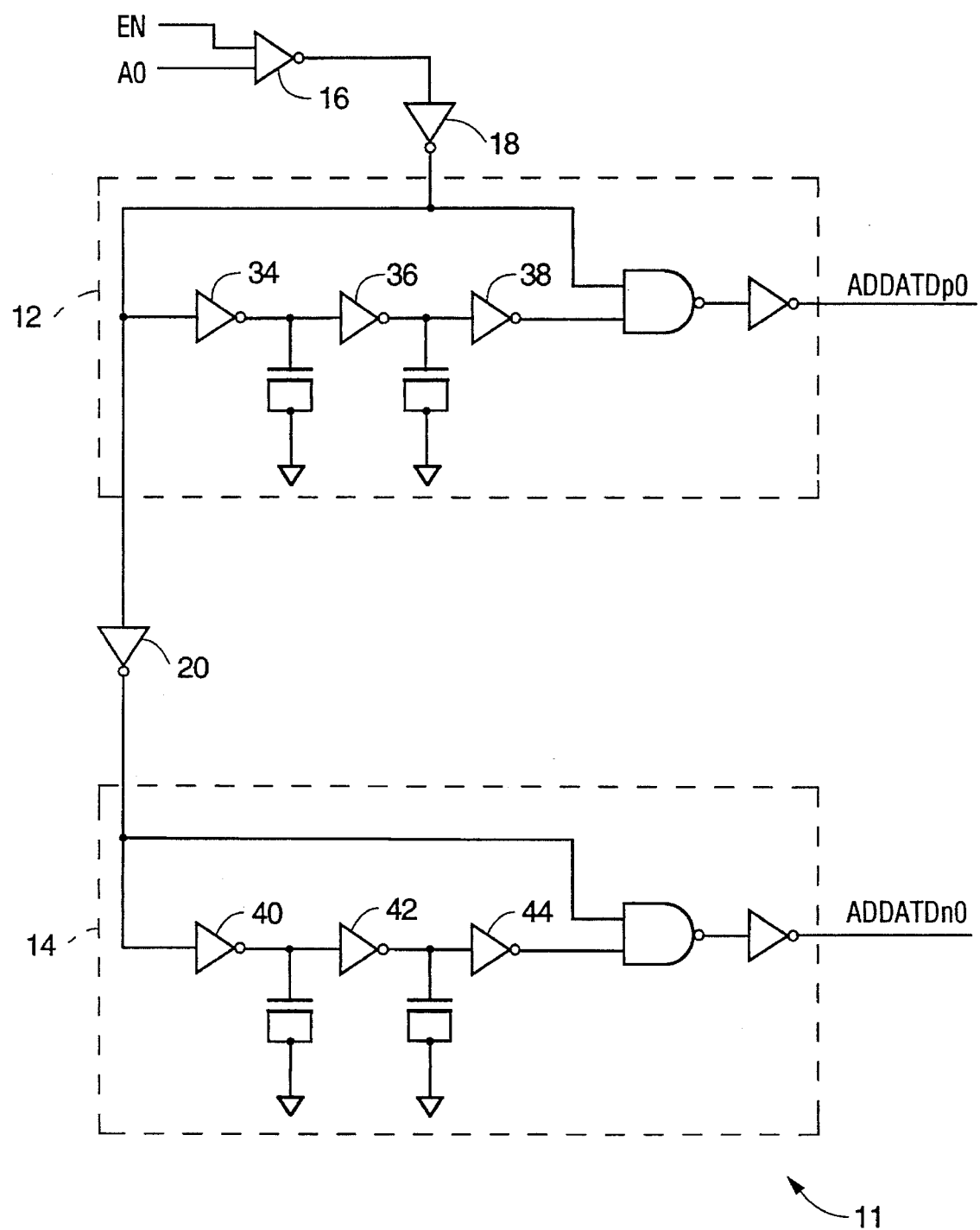
FIG. 3 is a schematic diagram illustrating one of the prior art address cells shown in FIG. 2.
Figure 4:
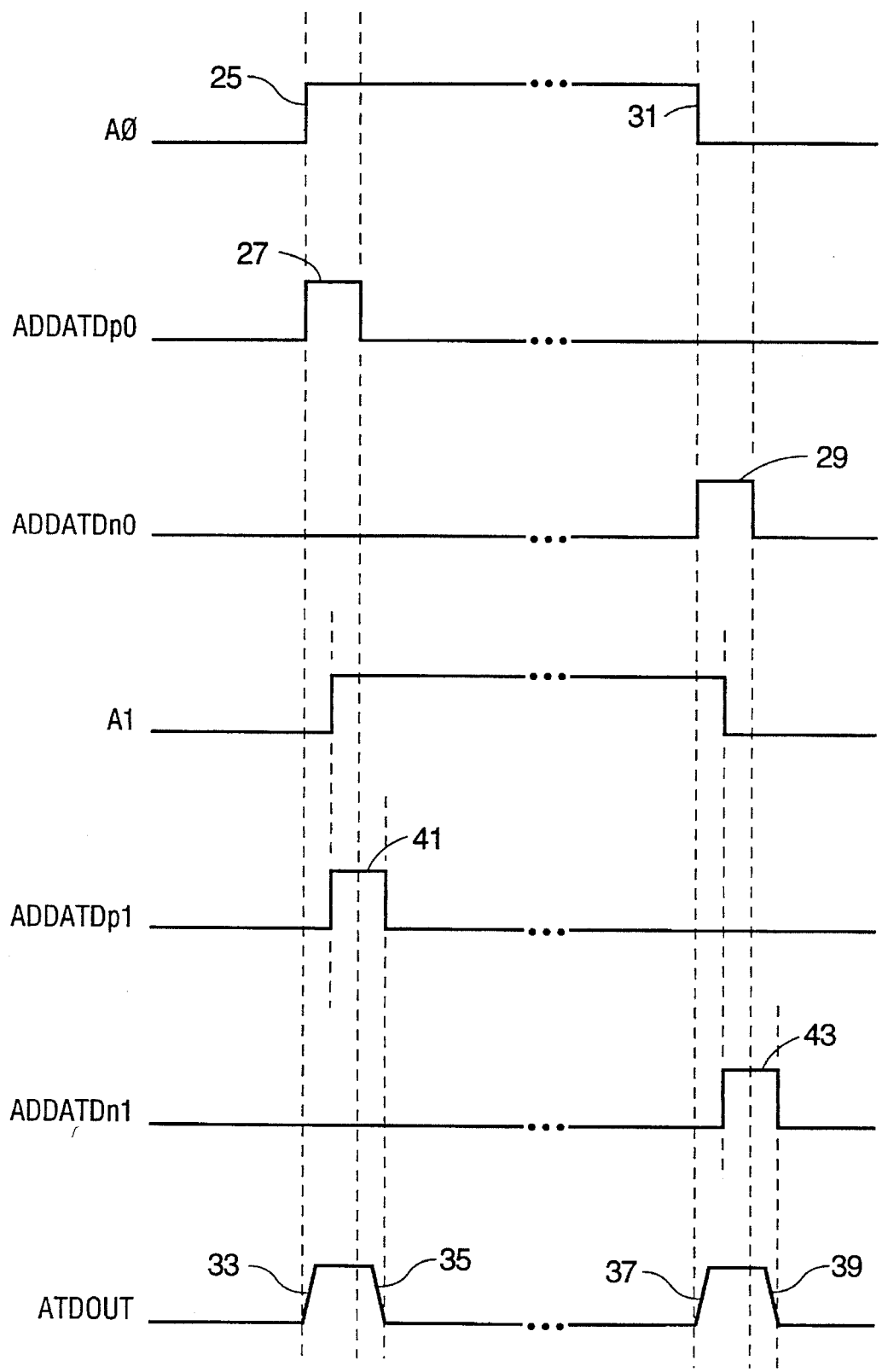
FIG. 4 is a timing diagram illustrating the operation of the ATD circuit shown in FIG. 2.

Unlike the prior art address cell 11 shown in FIG. 3, the address cell 46 does not have two active pulse generation mechanisms for indicating positive and negative address transitions, i.e., the are no AddATDp and AddATDn outputs. Instead, as shown in FIG. 5, the outputs ATD_ and ATDpu_ are shared by all of the address cells 46, 92, 94, and 96 in the ATD circuit 98. Specifically, the ATD_ outputs of all of the address cells 46, 92, 94, and 96 are wire ORed together, and the ATDpu_ outputs of all of the address cells 46, 92, 94, and 96 are wire ORed together. These two signals are then routed to an ATD generation circuit 102.

In the ATD generation circuit 102, the ATD_ output is used as the input to the NOR gate 100. The output of the NOR gate 100 generates the output ATDout. The ATDpu_ output drives the gate of a p-channel transistor 104 that is used as a load for the ATD generation circuit 102. The output of the NOR gate 100, which corresponds to the output ATDout, is fed back to the gate of an n-channel transistor 106 which has its source grounded and its drain coupled to the gate of the load p-channel transistor 104. Another n-channel transistor 108 has its source grounded, its drain coupled to the gate of p-channel transistor 104, and its gate coupled to the voltage supply VCC. The n-channel transistor 108 is a very weak device and is used to initialize the voltage on the gate of the load p-channel transistor 104 during non-operational modes of the circuit.

Figure 7:
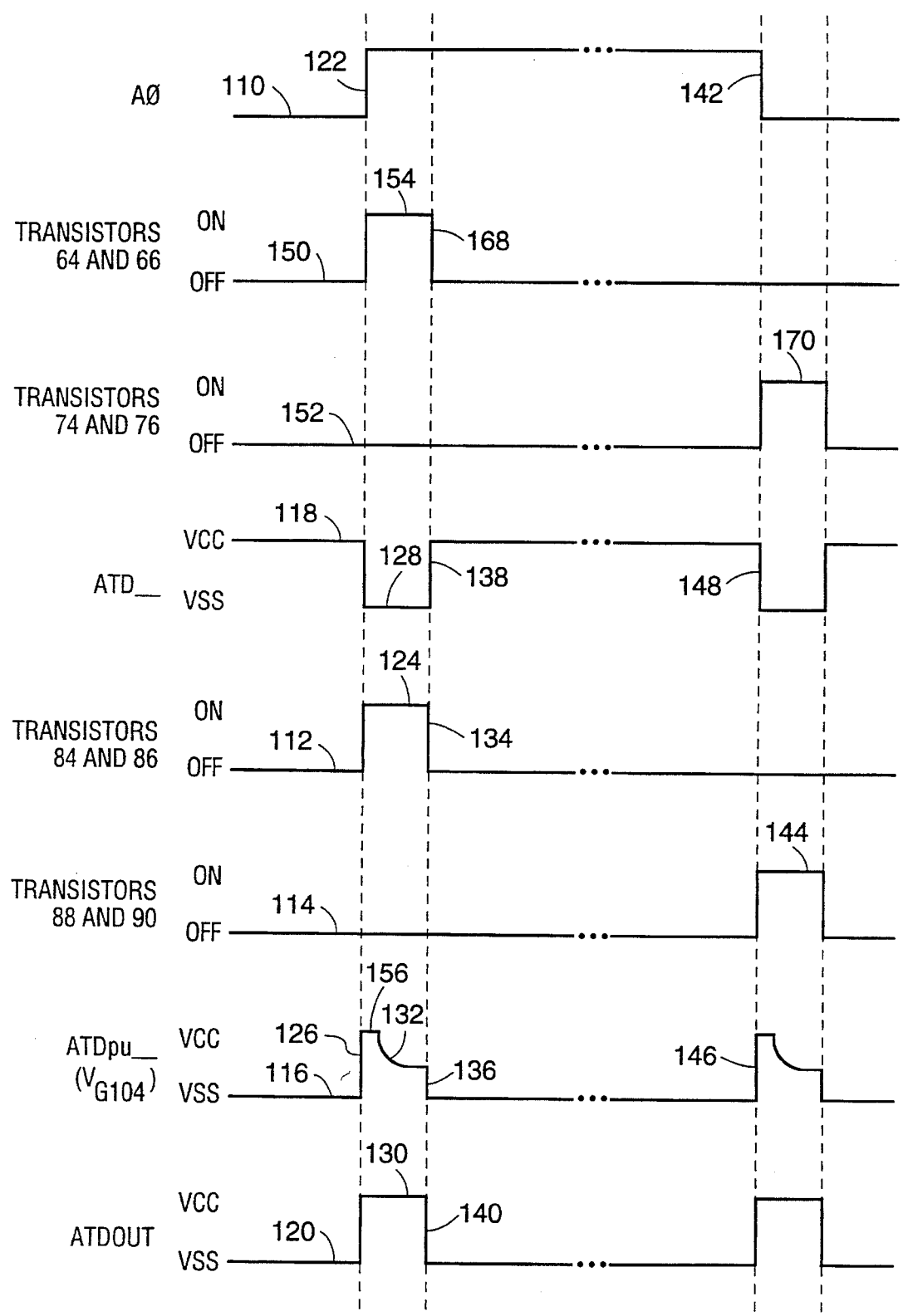
FIGS. 7 and 8 are timing diagrams illustrating the operation of the ATD circuit shown in FIG. 5.
Figure 8:
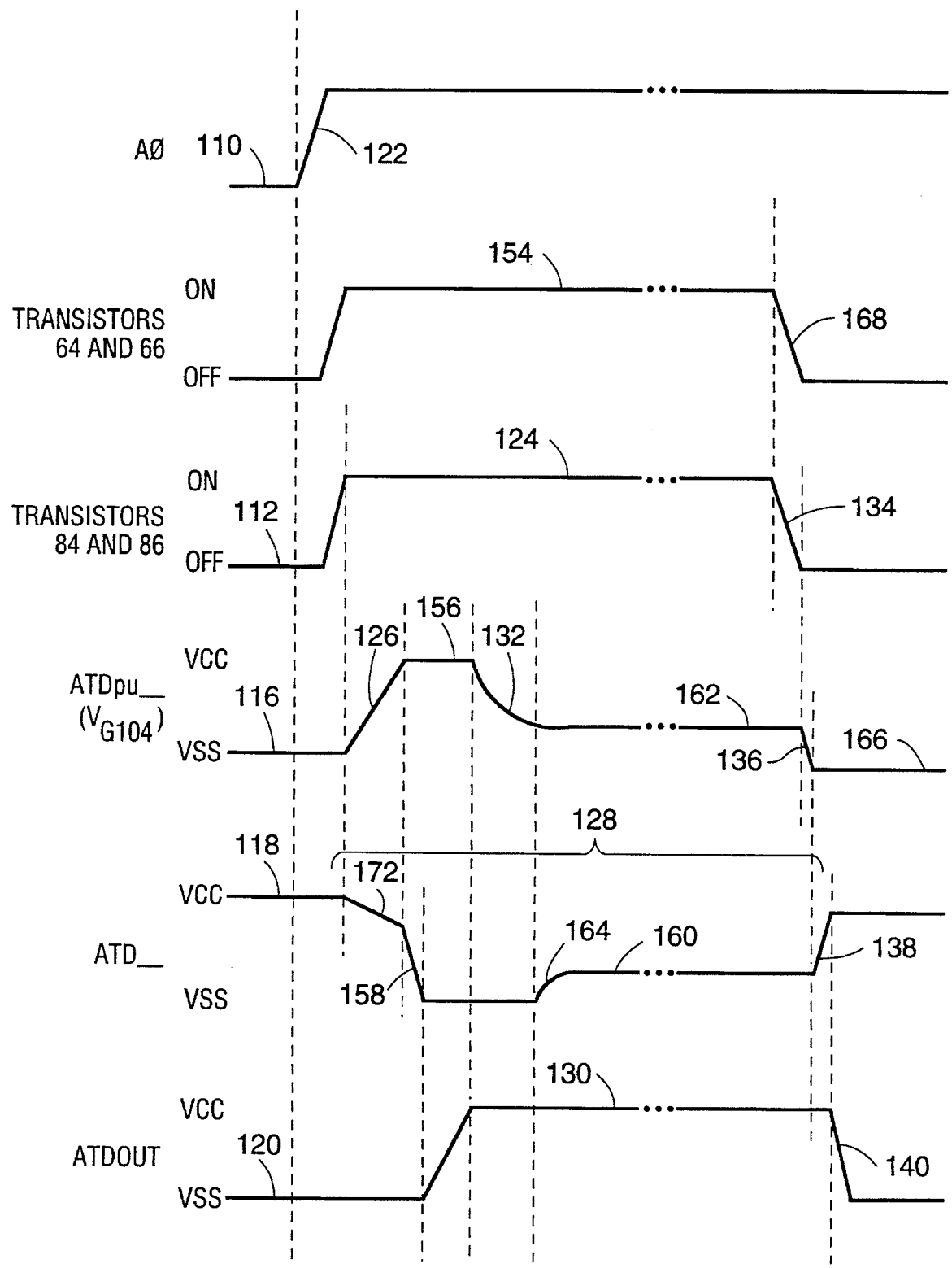

The operation of the ATD circuit 98 is best explained by referring to FIGS. 7 and 8. FIG. 7 illustrates the general operation of the ATD circuit 98, and FIG. 8 illustrates the operation in more detail showing the various delays involved. It should first be noted that the ATDpu_ output is the same node as the gate of the load p-channel transistor 104; i.e., $V_{ATDpu\_}=V_{G104}$.

Before a transition occurs on address line A0, as indicated by 110, p-channel transistors 86 and 90 are both turned off, as indicated by 112 and 114. This means that the pull up circuit 82 is not pulling up the gate of the load p-channel transistor 104, as indicated by 116. Instead, the small n-channel transistor 108 pulls down the gate of the load p-channel transistor 104 which turns it on. Furthermore, n-channel transistors 64 and 76 are both turned off, as indicated by 150 and 152, which means that the ATD_ output is not being pulled down by the one shots 48 and 50. This allows the load p-channel transistor 104 to pull up the ATD_ output, as indicated by 118. As long as the ATD_ output is high, the ATDout output remains low, as indicated by 120, due to the operation of the NOR gate 100.

When a positive transition occurs on address line A0, as indicated by 122, p-channel transistors 84 and 86 are turned on simultaneously, indicated by 124, for a period of time equal to the delay caused by inverters 58 and 60 together with capacitor connected transistor 78. This causes the ATDpu_ output (i.e., $V_{G104}$), to be pulled up very quickly, indicated by 126. Although the small n-channel transistor 108 continues to try to pull down the ATDpu_ output, the size of the transistors in the pull up circuit 82 is such that they can easily overpower transistor 108. Because the ATDpu_ output is pulled high 126 just after the positive transition 122 on address line A0, the load p-channel transistor 104 is momentarily turned off, indicated by 156.

Another result of the positive transition 122 on address line A0 is that n-channel transistors 64 and 66 turn on simultaneously, indicated by 154, for a period of time equal to the delay caused by inverters 58, 60, and 62 together with capacitor connected transistor 78. This pulls down the ATD_ output for approximately the same period of time, indicated generally by 128. Assuming that the enable ATD_{EN\_} is pulled low, the ATDout output goes high 130 in response to the ATD_ output being pulled low 128.

FIG. 8 shows the detailed timing involved when the ATD_ output is pulled low, indicated generally by 128. The n-channel transistors 64 and 66 pull down the ATD_ output while fighting the load p-channel transistor 104, indicated by 172. However, during the period 156 that the load p-channel transistor 104 is momentarily turned off, it does not try to pull the ATD__ output high, which accelerates the rate at which the n-channel transistors 64 and 66 pull down the ATD__ output, indicated by 158.

When the ATDout output goes high 130, the feedback n-channel transistor 106 turns on. The feedback n-channel transistor 106 tries to pull down the gate of the load p-channel transistor 104 (i.e., ATDpu__). The feedback n-channel transistor 106 is designed to pull the gate of p-channel transistor 104, indicated by 132, as close to ground as possible for best recovery effects, indicated by 162. In other words, the lower the ATDpu__ output, the faster the ATD__ output will be pulled up after the pull down transistors 74 and 76 or 64 and 66 have turned off. Pulling the ATDpu__ output lower does tend to pull up the ATD__ output a bit, indicated by 164. However, the ratio of the load p-channel transistor 104 to the pull down transistors 74 and 76 or 64 and 66 is chosen so that the pull down transistors keep the ATD__ output below the trip point of NOR gate 100, indicated by 160, even if transistor 104 is fully turned on.

Depending on how many of the address lines A0–AN transition at the same time or essentially the same time, the pull up transistors 84 and 86 from many of the address cells 46, 92, 94 or 96 could turn on and all might try to pull up the ATDpu__ output. In this situation, the feedback transistor 106 would be fighting more than one set of pull up transistors 84 and 86 to pull down the gate of the load p-channel transistor 104.

It is conceivable to design the feedback transistor 106 large enough to pull down the gate of the load transistor 104 even if the pull up transistors 84 and 86 or 88 and 90 of each address cell 46, 92, 94, and 96 turn on. Such a large feedback transistor 106, however, could become a large capacitive load on the ATDout output and slow the assertion and deassertion of that signal. Thus, the size of the feedback transistor 106 is chosen such that it has the strength to pull the gate of the load p-channel transistor 104 as close to ground as possible 162 when the maximum number of address lines A0–AN are transitioning without noticeable load increase on the ATDout output. In this scenario, the ATDpu__ output will be pulled to a voltage between VCC and VSS, as indicated by 162, and referred to herein as a "semi-on" state. The exact voltage to which the ATDpu__ output is pulled will depend on how many address inputs changed during the same period.

Because the load p-channel transistor 104 is in this "semi-on" state, it tries to pull the ATD__ output high, indicated by 164. However, the ratio of the sizes of the load p-channel transistor 104 to the pull down n-channel transistors 64 and 66 is such that the ATD__ output is not pulled above the trip point of the NOR gate 100, indicated by 160.

After the delay caused by inverters 58 and 60 has lapsed, p-channel transistor 84 turns off, indicated by 134. This releases the gate of the load p-channel transistor 104 (i.e., ATDpu__) from being pulled up. Because the feedback n-channel transistor 106 is still turned on, the gate of the load p-channel transistor 104 is pulled down very quickly, indicated by 136. This results in the load p-channel transistor 104 being fully turned on, indicated by 166.

After the delay caused by inverters 58, 60, and 62 has lapsed, n-channel transistor 66 turns off, indicated by 168, which results in the ATD__ output no longer being pulled low by the one shot 48. Because the load p-channel transistor 104 is fully turned on, the ATD__ output is pulled high very quickly, indicated by 138. In other words, the load p-channel transistor 104 accelerates the rate at which the ATD__ output is pulled high. This causes the ATDout output to be pulled low very quickly, indicated by 140. The ATDout output going low turns off the feedback n-channel transistor 106. However, the gate of the load p-channel transistor 104 is held low by the small n-channel transistor 108.

At this point the ATD circuit 98 is in the same state that it was in just before address line A0 experienced a positive transition 122. When the address line A0 experiences a negative transition 142, the operation of the circuit is much the same, except that p-channel transistors 88 and 90, indicated by 144, pull up the ATDpu__ output, indicated by 146, and n-channel transistors 74 and 76, indicated by 170, pull down the ATD__ output, indicated by 148.

The ATDout output pulse generated by the ATD circuit 98 is asserted very fast in response to an address line transition. Specifically, because the load p-channel transistor 104 is momentarily turned off during the transition, indicated by 156, the ATD__ output can be pulled low very quickly by the one shot 48 or 50 which results in the ATDout output going high very quickly. In other words, assertion of the ATD__ output is accelerated because the load p-channel transistor 104 is momentarily turned off by assertion of the ATDpu__ output.

One of the disadvantages of the prior art ATD circuit 10 discussed above is the delay in the deassertion of the ATDout output when all of the AddATDp and AddATDn signals have been deasserted. In contrast, the ATDout output pulse generated by the ATD circuit 98 of the present invention is deasserted very fast after all address lines have transitioned and stabilized. Specifically, the load p-channel transistor 104 is used to pull the ATD__ output up quickly, or accelerate its deassertion, which quickly deasserts the ATDout output. In order for the load p-channel transistor 104 to perform this function, it should preferably be turned on very quickly when the pull down n-channel transistors 64, 66, 74, and 76 turn off to release the ATD__ output. However, once the pull up p-channel transistors 84, 86, 88, and 90 turn off, there is a delay before they can disconnect from the voltage supply VCC and the small n-channel transistor 108 can pull down the ATDpu__ output (i.e., $V_{G104}$). This delay could cause a delay in turning on the load p-channel transistor 104.

In order to prevent the delay in the ATDpu__ output being pulled down, the feedback n-channel transistor 106 is used to quickly pull down the gate of the load p-channel transistor 104. Specifically, when the pull up p-channel transistors 84, 86, 88, and 90 turn off and release the gate of the load p-channel transistor 104, the feedback n-channel transistor 106, which is already turned on by the ATDout output, pulls the ATDpu__ output down to speed up the disconnection of p-channel transistors 84, 86, 88, and 90 from the voltage supply VCC.

By turning on the feedback n-channel transistor 106 before the pull up circuit 82 releases the ATDpu__ output, the ATD circuit 98 puts itself in a state ready to respond fast to the ATDpu__ output being released by the pull up circuit 82. As discussed above, the feedback n-channel transistor 106 pulls the gate of the load p-channel transistor 104 down to a level between VCC and VSS such that transistor 104 is biased to a "semi-on" state. Because the load p-channel transistor 104 is in this "semi-on" state, it is able to pull up the ATD__ output quickly when the one shots 48 or 50 release it.

The ATD circuit 98 of the present invention improves both the turn on and turn off characteristics of the ATDout output pulse over the prior art while keeping the die area penalty under control. Specifically, the ATD circuit 98 requires only two signal lines to be routed around the memory die, namely, the ATDpu_ and ATD_ outputs. This decreases the amount of required silicon real estate over the prior art ATD circuit 10 discussed above.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. An address transition detection (ATD) circuit for use in a memory, comprising:

input means for receiving an address signal;

discharging means for providing a discharge path from a first node to a first voltage reference node for a first time period in response to a change in state of the address signal;

charging means for providing a charging path from a second voltage reference node to a second node for a second time period in response to a change in state of the address signal; and load means for accelerating discharging of the first node by turning off in response to charging of the second node and for accelerating charging of the first node in response to expiration of the second time period.

2. An ATD circuit in accordance with claim 1, wherein the load means comprises:

a first p-channel transistor having a drain coupled to the first node, a gate coupled to the second node, and a source coupled to the second voltage reference node.

3. An ATD circuit in accordance with claim 1, further comprising:

output means for generating an output pulse in an output node in response to the first node being discharged; and feedback means for at least partially discharging the second node in response to the output pulse.

4. An ATD circuit in accordance with claim 3, wherein the feedback means comprises:

a first n-channel transistor having a drain coupled to the second node, a gate coupled to the output node, and a source coupled to the first voltage reference node.

5. An address transition detection (ATD) circuit for use in a memory, comprising:

input means for receiving an address signal;

first pulse means for generating a first pulse in a first node in response to a change in state of the address signal;

second pulse means for generating a second pulse in a second node in response to a change in state of the address signal; and load means, coupled to the first and second nodes, for accelerating assertion of the first pulse in response to assertion of the second pulse and for accelerating deassertion of the first pulse in response to deassertion of the second pulse.

6. An ATD circuit in accordance with claim 5, further comprising:

output means, coupled to the first node, for generating an output pulse in an output node in response to the first pulse; and feedback means, coupled to the second and output nodes, for preparing the load means to accelerate deassertion of the first pulse in response to the output pulse.

7. An ATD circuit in accordance with claim 5, wherein the first pulse means comprises:

first and second series connected n-channel transistors coupled to provide a discharge path from the first node to a first voltage reference node to generate the first pulse; and delay means, coupled to the second n-channel transistor, for turning the second n-channel transistor on simultaneously with the first n-channel transistor for a first time period equal to a width of the first pulse.

8. An ATD circuit in accordance with claim 5, wherein the second pulse means comprises:

first and second series connected p-channel transistors coupled to provide a charging path from a second voltage reference node to the second node to generate the second pulse; and delay means, coupled to the second p-channel transistor, for turning the second p-channel transistor on simultaneously with the first p-channel transistor for a second time period equal to a width of the second pulse.

9. An ATD circuit in accordance with claim 8, wherein the delay means comprises an odd number of CMOS inverters coupled to a gate of the second p-channel transistor.

10. An ATD circuit in accordance with claim 6, wherein the output means comprises:

a first logic gate having an inverting function, a first input and an output, the first input being coupled to the first node and the output being coupled to the output node.

11. An ATD circuit in accordance with claim 10, wherein the first logic gate comprises a NOR gate.

12. An ATD circuit in accordance with claim 6, wherein the feedback means comprises:

a third n-channel transistor having a drain coupled to the second node, a gate coupled to the output node, and a source coupled to a first voltage reference node.

13. An ATD circuit in accordance with claim 5, wherein the load means comprises:

a third p-channel transistor having a drain coupled to the first node, a gate coupled to the second node, and a source coupled to a second voltage reference node.

14. An ATD circuit in accordance with claim 5, further comprising:

pull down means, coupled to the second node, for providing a discharge path from the second node to a first voltage reference node.

15. An ATD circuit in accordance with claim 14, wherein the pull down means comprises:

a fourth n-channel transistor having a drain coupled to the second node, a source coupled to the first voltage reference node, and a gate coupled to a second voltage reference node.

16. A memory system, comprising:

an array of memory cells;

input means for receiving a plurality of address signals;

decoder means, coupled to the array of memory cells, for decoding the plurality of address signals to select a row and a column of the array of memory cells;

a plurality of address cells coupled to the input means so that each address cell receives an associated one of the address signals, each of the address cells including first and second pulse means for generating first and second pulses, respectively, in response to a change in state of the associated address signal; and an output circuit including load means for accelerating assertion of the first pulse generated by any one of the address cells in response to assertion of the second pulse and for accelerating deassertion of the first pulse generated by any one of the address cells in response to deassertion of the second pulse.

17. A memory system in accordance with claim 16, wherein the output circuit comprises:

a first node coupled to at least some of the address cells to receive the first pulse; and a second node coupled to at least some of the address cells to receive the second pulse.

18. A memory system in accordance with claim 16, wherein the output circuit further comprises:

output means for generating an output pulse in response to the first pulse generated by any one of the address cells; and feedback means for preparing the load means to accelerate deassertion of the first pulse in response to the output pulse.

19. A memory system in accordance with claim 17, wherein the first pulse means of each of the address cells comprises:

first and second series connected n-channel transistors coupled to provide a discharge path from the first node to a first voltage reference node to generate the first pulse; and delay means, coupled to the second n-channel transistor, for turning the second n-channel transistor on simultaneously with the first n-channel transistor for a first time period equal to a width of the first pulse.

20. A memory system in accordance with claim 17, wherein the second pulse means of each of the address cells comprises:

first and second series connected p-channel transistors coupled to provide a charging path from a second voltage reference node to the second node to generate the second pulse; and delay means, coupled to the second p-channel transistor, for turning the second p-channel transistor on simultaneously with the first p-channel transistor for a second time period equal to a width of the second pulse.

21. A memory system in accordance with claim 20, wherein the delay means comprises an odd number of CMOS inverters coupled to a gate of the second p-channel transistor.

22. A memory system in accordance with claim 18, wherein the output means comprises:

a first logic gate having an inverting function, a first input and an output, the first input coupled to receive the first pulse generated by any of the address cells.

23. A memory system in accordance with claim 22, wherein the first logic gate comprises a NOR gate.

24. A memory system in accordance with claim 18, wherein the feedback means comprises:

a third n-channel transistor having a drain coupled to receive the second pulse generated by any of the address cells, a gate coupled to receive the output pulse, and a source coupled to a first voltage reference node.

25. A memory system in accordance with claim 16, wherein the load means comprises:

a third p-channel transistor having a drain coupled to pull up the first pulse generated by any of the address cells, a gate coupled to receive the second pulse generated by any of the address cells, and a source coupled to a second voltage reference node.

26. A method of detecting address line transitions in a memory, comprising the steps of:

(a) generating a first pulse in a first node in response to a change in state of an address signal;

(b) generating a second pulse in a second node in response to a change in state of the address signal;

(c) accelerating assertion of the first pulse in response to assertion of the second pulse;

(d) generating an output pulse in an output node in response to the first pulse;

(e) feeding the output pulse back to be used to prepare for deassertion of the first pulse in response to the output pulse; and (f) accelerating deassertion of the first pulse in response to deassertion of the second pulse.

27. A method in accordance with claim 26, wherein step (e) comprises the step of:

at least partially discharging the second node with a first n-channel transistor having a gate coupled to the output node.

28. A method in accordance with claim 26, wherein step (f) comprises the step of:

charging the first node with a first p-channel transistor having a gate coupled to the second node.

29. An address transition detection (ATD) circuit for use in a memory, comprising:

an input circuit which receives an address signal;

a discharging circuit coupled to the input circuit which completes a discharge path from a first node to a first voltage reference node for a first time period in response to a change in state of the address signal;

a charging circuit coupled to the discharge circuit which completes a charging path from a second voltage reference node to a second node for a second time period in response to a change in state of the address signal; and a load circuit coupled to the first and second nodes which accelerates discharging of the first node by turning off in response to charging of the second node and which accelerates charging of the first node in response to expiration of the second time period.

30. An ATD circuit in accordance with claim 29, wherein the load circuit comprises:

a first p-channel transistor having a drain coupled to the first node, a gate coupled to the second node, and a source coupled to the second voltage reference node.

31. An ATD circuit in accordance with claim 29, further comprising:

an output circuit which generates an output pulse in an output node in response to the first node being discharged; and a feedback circuit which at least partially discharges the second node in response to the output pulse.

32. An ATD circuit in accordance with claim 31, wherein the feedback circuit comprises:

a first n-channel transistor having a drain coupled to the second node, a gate coupled to the output node, and a source coupled to the first voltage reference node.

33. An address transition detection (ATD) circuit for use in a memory, comprising:

an input circuit which receives an address signal;

a first pulse generator which generates a first pulse in a first node in response to a change in state of the address signal;

a second pulse generator which generates a second pulse in a second node in response to a change in state of the address signal; and a load circuit, coupled to the first and second nodes, which accelerates assertion of the first pulse in response to assertion of the second pulse and which accelerates deassertion of the first pulse in response to deassertion of the second pulse.

34. An ATD circuit in accordance with claim 33, further comprising:

an output circuit, coupled to the first node, which generates an output pulse in an output node in response to the first pulse; and a feedback circuit, coupled to the second and output nodes, which prepares the load means to accelerate deassertion of the first pulse in response to the output pulse.

35. An ATD circuit in accordance with claim 33, wherein the first pulse generator comprises:

first and second series connected n-channel transistors coupled to provide a discharge path from the first node to a first voltage reference node to generate the first pulse; and a delay circuit, coupled to the second n-channel transistor, which turns the second n-channel transistor on simultaneously with the first n-channel transistor for a first time period equal to a width of the first pulse.

36. An ATD circuit in accordance with claim 33, wherein the second pulse generator comprises:

first and second series connected p-channel transistors coupled to provide a charging path from a second voltage reference node to the second node to generate the second pulse; and a delay circuit, coupled to the second p-channel transistor, which turns the second p-channel transistor on simultaneously with the first p-channel transistor for a second time period equal to a width of the second pulse.

37. An ATD circuit in accordance with claim 36, wherein the delay circuit comprises an odd number of CMOS inverters coupled to a gate of the second p-channel transistor.

38. A method of detecting address line transitions in a memory, comprising the steps of:

discharging a first node for a first time period in response to a change in state of an address signal;

charging a second node for a second time period in response to a change in state of the address signal;

accelerating discharging of the first node in response to charging of the second node; and accelerating charging of the first node in response to expiration of the second time period.

39. A method in accordance with claim 38, further comprising the step of:

generating an output pulse in an output node in response to the step of discharging the first node; and feeding the output pulse back to be used to prepare for charging of the first node.

40. A method in accordance with claim 39, wherein the feeding step comprises the step of:

at least partially discharging the second node with a first n-channel transistor having a gate coupled to the output node.

41. A method in accordance with claim 38, wherein the step of accelerating charging of the first node comprises the step of:

charging the first node with a first p-channel transistor having a gate coupled to the second node.

* * * * *